(12) United States Patent
Kwon et al.

(10) Patent No.: US 11,792,893 B2
(45) Date of Patent: Oct. 17, 2023

(54) MATERIAL-REMOVING HEATER DEVICE

(71) Applicant: Samsung Display Co., LTD., Yongin (KR)

(72) Inventors: Ohjune Kwon, Hwaseong-si (KR); Jungsik Nam, Seoul (KR); Seungwook Kwon, Hwaseong-si (KR); Hyojeong Kwon, Hwaseong-si (KR); Minsang Kim, Suwon-si (KR); Chanho Moon, Busan (KR); Jeongseok Lee, Yongin-si (KR); Wonje Cho, Osan-si (KR); Taekyoung Hwang, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 634 days.

(21) Appl. No.: 16/748,106

(22) Filed: Jan. 21, 2020

(65) Prior Publication Data
US 2020/0296801 A1 Sep. 17, 2020

(30) Foreign Application Priority Data
Mar. 11, 2019 (KR) .......................... 10-2019-0027650

(51) Int. Cl.
*H05B 3/03* (2006.01)
*H05B 3/00* (2006.01)
*H10K 77/10* (2023.01)

(52) U.S. Cl.
CPC ............ *H05B 3/03* (2013.01); *H05B 3/0023* (2013.01); *H05B 2203/017* (2013.01); *H10K 77/111* (2023.02)

(58) Field of Classification Search
CPC . H01L 51/0097; H01L 51/56; H01L 51/5237; Y02P 70/62; Y10T 29/49126; Y10T 29/4913; Y10T 29/49144; Y10T 29/49147; Y10T 29/49149; Y10T 29/5313; Y10T 29/5317; Y10T 29/53174;
(Continued)

(56) References Cited

U.S. PATENT DOCUMENTS 9,516,743 B2   12/2016   Kim et al.
9,614,168 B2   4/2017   Zhang et al.
(Continued)

FOREIGN PATENT DOCUMENTS

KR        101533682 B1    6/2015
KR     1020180032742 A    4/2018

*Primary Examiner* — John J Norton
*Assistant Examiner* — Simpson A Chen
(74) *Attorney, Agent, or Firm* — CANTOR COLBURN LLP

(57) ABSTRACT

A material-removing heater device including: a first terminal portion defining a first electrode; a second terminal portion defining a second electrode; and a heating portion which connects the first terminal portion to the second terminal portion, the heating portion heatable by a flow of electrical current from the first terminal portion to the second terminal portion to remove a portion of material of a display device. The heating portion defines a lower end surface of the material-removing heater device at which the material-removing heater device contacts the material of the display device, the heating portion disposes the lower end surface to have a concave shape, and the heating portion which is heated deforms the lower end surface from the concave shape to have a planar shape.

18 Claims, 12 Drawing Sheets

(58) Field of Classification Search
CPC ............... H05K 3/3494; H05K 3/361; H05K
2201/0129; H05K 2203/0195; H05B 3/03;
H05B 3/42; H05B 3/02; H05B 3/0023;
G09F 9/301; G02F 1/1303; G02F
1/133305; G06F 1/1641
USPC ........................... 29/739; 219/228, 229, 230
See application file for complete search history.

(56) References Cited

U.S. PATENT DOCUMENTS

| | | | |
|---|---|---|---|
| 2004/0211057 A1* | 10/2004 | Totani | H05K 3/361 |
| | | | 29/729 |
| 2006/0077691 A1* | 4/2006 | Kim | G02B 6/0051 |
| | | | 362/617 |
| 2007/0035937 A1* | 2/2007 | Colbert | H01L 23/4006 |
| | | | 361/810 |
| 2014/0326707 A1* | 11/2014 | Schmitz | G01Q 30/10 |
| | | | 219/201 |
| 2018/0059728 A1* | 3/2018 | Kim | H01L 51/0097 |
| 2018/0246544 A1 | 8/2018 | Kwon et al. | |

* cited by examiner

MATERIAL-REMOVING HEATER DEVICE

This application claims priority to Korean Patent Application No. 10-2019-0027650, filed on Mar. 11, 2019, and all the benefits accruing therefrom under 35 U.S.C. § 119, the disclosure of which is incorporated by reference herein in its entirety.

BACKGROUND

1. Field

Embodiments of the invention relate to a bending device with which a target object is removed from another member. More particularly, embodiments of the invention relate to a material-removing device using a heater of a resistance heating type and with which a film may be uniformly removed from a component of a display device in a chip on panel ("COP") process during manufacturing of the display device.

2. Discussion of the Related Art

Display devices may be bendable into a specific form or shape since display panels of the display devices include a relatively soft substrate, instead of a relatively hard substrate, thus having flexibility. A material-removing device using a heater may be used to remove portions of a film provided on the relatively soft substrate of the display panels, such that the film is effectively patterned to maintain other portions of the film on the display panels.

SUMMARY

Embodiments provide a bending device (e.g., material-removing device) used in manufacturing display devices and capable of uniformly removing portions of a film, by using a heater of a resistance heating type in a chip on panel (COP) process of the display devices.

According to an embodiment, a material-removing heater device includes: a first terminal portion defining a first electrode; a second terminal portion defining a second electrode; and a heating portion which connects the first terminal portion to the second terminal portion, the heating portion heatable by a flow of electrical current from the first terminal portion to the second terminal portion to remove a portion of material of a display device. The heating portion defines a lower end surface of the material-removing heater device at which the material-removing heater device contacts the material of the display device, the heating portion disposes the lower end surface to have a concave shape, and the heating portion which is heated deforms the lower end surface from the concave shape to have a planar shape.

The heating portion may have a thickness less than a thickness of each of the first terminal portion and the second terminal portion.

The heating portion may include a first inner surface and a second inner surface which face each other, the first terminal portion may include an inner surface which faces an inner surface of the second terminal portion, the first inner surface of the heating portion and the inner surface of the first terminal portion may be coplanar with each other, and the second inner surface of the heating portion and the inner surface of the second terminal portion may be coplanar with each other.

The first terminal portion, the second terminal portion and the heating portion may together define a first heat dissipation groove of the material-removing heater device at which the first inner surface and the second inner surface of the heating portion face each other.

A terminal portion among the first terminal portion and the second terminal portion may define a second heat dissipation groove recessed from an outer surface of the terminal portion and open to outside the material-removing heater device, a first direction may be defined from the heating portion to the terminal portion, and a maximum dimension of the second heat dissipation groove may be extended along the first direction.

A second direction crossing the first direction may be defined between ends of the material-removing heater device, and the second heat dissipation groove may be provided in plural including a plurality of second heat dissipation grooves arranged spaced apart from each other along the second direction.

The material-removing heater device may define a maximum dimension thereof as a length, a terminal portion among the first terminal portion and the second terminal portion may define a plurality of through holes arranged spaced apart from each other along the length of the material-removing heater device, and each of a through hole among the plurality of through holes may be extended from an outer surface of the terminal portion to an inner surface thereof, the through hole being open to outside the material-removing heater device.

A first direction may be defined from the heating portion to the terminal portion, and the through hole may have a circular shape or an elliptical shape which has a major axis along the first direction.

The heating portion may further include: a first connection portion extended from the first terminal portion, a second connection portion extended from the second terminal portion and facing the first connection portion, and a third connection portion connecting the first connection portion and the second connection portion to each other, the third connection portion defining the lower end surface of the material-removing heater device. The first connection portion may define a thickness thereof which decreases as a distance from the first terminal portion increases, and the second connection portion may define a thickness thereof which decreases as a distance from the second terminal portion increases.

The heating portion which is heated to a temperature of about 300 degrees Celsius (° C.) or more and about 600° C. or less may deform the lower end surface from the concave shape to have the planar shape.

The heating portion which is heated may generate a heat having a temperature higher than a temperature at which the material of the display device is melted.

The heating portion may extend from both the first terminal portion and the second terminal portion along a first direction, a second direction crossing the first direction may be defined between ends of the material-removing heater device, and the heating portion which is heated may define a maximum deformation distance between the concave shape and the planar shape along the first direction and at a central portion of the material-removing heater device along the second direction.

Along the second direction, a length of the lower end surface of the heating portion which has the concave shape may be less than a length of each of the first terminal portion and the second terminal portion.

Along the second direction, a length of the lower end surface of the heating portion which has the planar shape may be equal to the length of each of the first terminal portion and the second terminal portion.

A material of the heating portion may include Invar, which is an alloy of steel and nickel.

A lower end surface of the heating portion may have the concave shape at a temperature of about 25° C., and may have the planar shape at a temperature of about 450° C.

The heating portion may have a coefficient of thermal expansion of about 1.3 ppm/° C. at a temperature is about 93° C., about 4.18 ppm/° C. at a temperature is about 260° C., and about 7.6 ppm/° C. at a temperature is about 371° C.

The heating portion may have an electrical resistivity in a range from about 0.000070 Ω/cm to about 0.00010 Ω/cm.

The heating portion may have a conductivity in a range from about 9.9 W/mK to about 10.5 W/mK.

The foregoing is illustrative only and is not intended to be in any way limiting. In addition to the illustrative embodiments and features described above, further embodiments and features will become apparent by reference to the drawings and the following detailed description.

BRIEF DESCRIPTION OF THE DRAWINGS

A more complete appreciation of the invention will become more apparent by describing in detail embodiments thereof with reference to the accompanying drawings, where.

DETAILED DESCRIPTION

Figure 1:
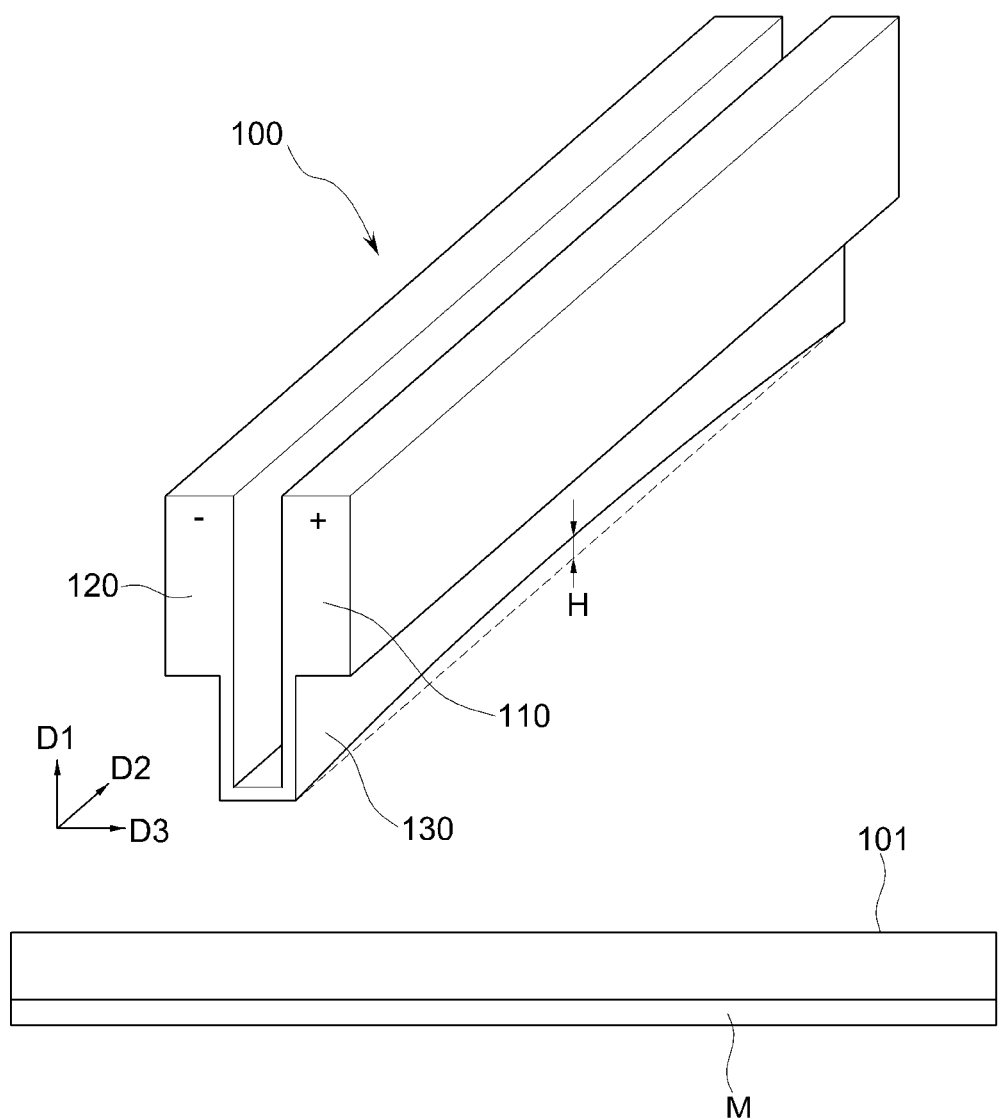
FIG. 1 is a perspective view illustrating an embodiment of a material-removing device before heating thereof, relative to a film.

Embodiments will now be described more fully hereinafter with reference to the accompanying drawings. Although the invention may be modified in various manners and have several embodiments, embodiments are illustrated in the accompanying drawings and will be mainly described in the specification. However, the scope of the invention is not limited to the embodiments and should be construed as including all the changes, equivalents and substitutions included in the spirit and scope of the invention. Like reference numerals refer to like elements throughout.

In the drawings, thicknesses of a plurality of layers and areas are illustrated in an enlarged manner for clarity and ease of description thereof. When a layer, area, or plate is referred to as being related to another element such as being "on" another layer, area, or plate, it may be directly on the other layer, area, or plate, or intervening layers, areas, or plates may be present therebetween. Conversely, when a layer, area, or plate is referred to as being related to another element such as being "directly on" another layer, area, or plate, intervening layers, areas, or plates are absent therebetween. Further when a layer, area, or plate is referred to as being related to another element such as being "below" another layer, area, or plate, it may be directly below the other layer, area, or plate, or intervening layers, areas, or plates may be present therebetween. Conversely, when a layer, area, or plate is referred to as being related to another element such as being "directly below" another layer, area, or plate, intervening layers, areas, or plates are absent therebetween.

The spatially relative terms "below," "beneath," "lower," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element (e.g., physical and/or mechanical contacted), or "electrically connected" to the other element with at least one intervening elements interposed therebetween.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of at least one other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Accordingly, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within at least one standard deviations, or within ±30%, 20%, 10% or 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A manufacturing process of a display device, such as a flexible display device including a display panel having a relatively soft or flexible substrate, may include a chip on panel ("COP") process in which portions of a film are removed from the display panel. A heater of a resistance heating type may be used to remove the portions of the film.

In a conventional manufacturing process, removal a film using a material-removing device (e.g., otherwise referred to herein as a "bending device") having a heater of a resistance heating type disposes a bottom surface of the material-removing device in a planar state before heating. After heating of the material-removing device, the bottom surface of the heater is convexly curved due to a thermal expansion characteristic thereof. Processes are performed to the display panel of the display device in a state that the bottom surface of the material-removing device contacting the display panel is in the convexly-curved shape. However, processing of the display panel by the material-removing device having the bottom surface in the convex shape contacting the display panel may provide a non-uniform flatness in an area of the display panel which is processed by the material-removing device.

Hereinafter, a material-removing device (e.g., a bending device 100) will be described with reference to FIGS. 1 to 11.

Figure 2:
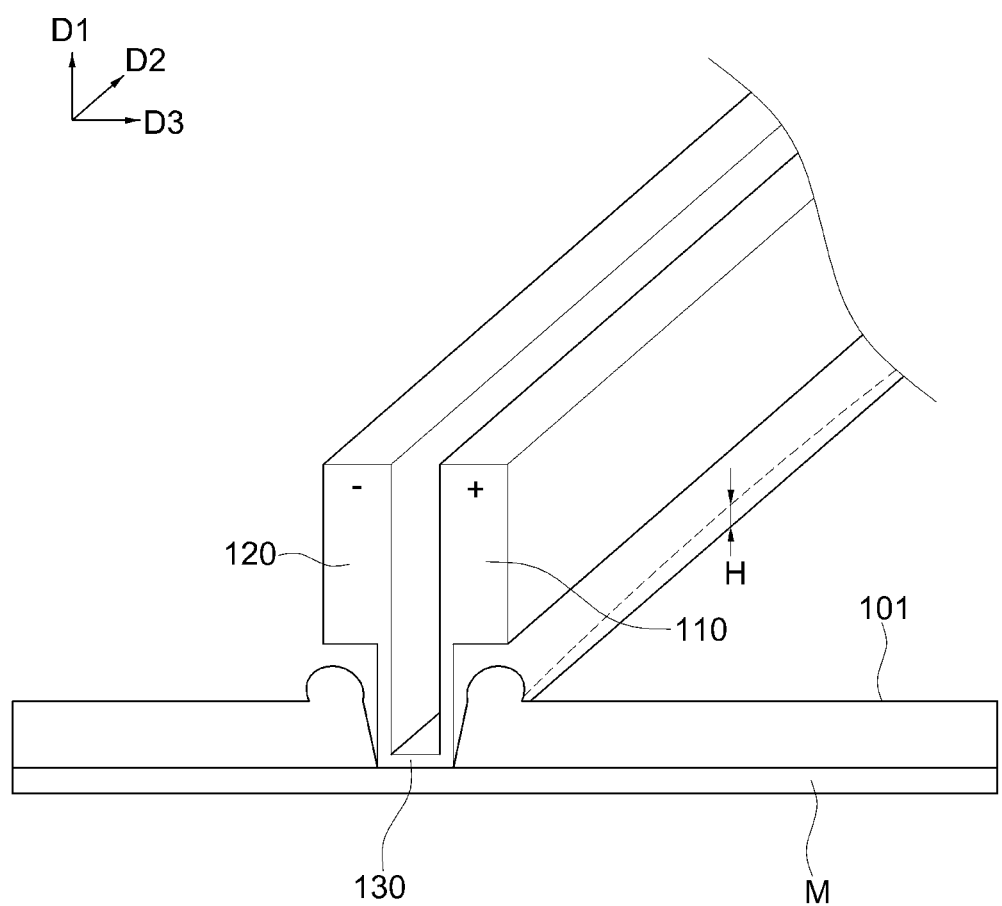
FIG. 2 is a perspective view illustrating the material-removing device which is heated, relative to the film.

FIG. 1 is a perspective view illustrating an embodiment of a bending device 100 before heating, relative to a film 101 which is processable by the bending device 100 while being disposed on a member M, and FIG. 2 is a perspective view illustrating an embodiment of a bending device 100 after heating, relative to the film 101 which is processable by the bending device 100 while being disposed on the member M.

Referring to FIGS. 1 and 2, a bending device 100 for a display device includes a first terminal portion 110, a second terminal portion 120, and a heating portion 130. The first terminal portion 110 and the second terminal portion 120 may extend from the heating portion 130, along a first direction D1. The bending device 100 may lengthwise extend along a second direction D2 crossing the first direction D1.

The first terminal portion 110 serves as a first electrode (+), and the second terminal portion 120 serves as a second electrode (−). In an alternative embodiment, the first terminal portion 110 may serve as the second electrode (−), and the second terminal portion 120 may serve as the first electrode (+). Of course, the first electrode may be a negative electrode, and the second electrode may be a positive electrode.

The first terminal portion 110 and the second terminal portion 120 may be spaced apart from each other by a predetermined distance with planar surfaces thereof facing each other. The first terminal portion 110 and the second terminal portion 120 may be spaced apart from each other along a third direction D3 crossing each of the first direction D1 and the second direction D2. The first direction D1, the second direction D2 and the third direction D3 may be respectively perpendicular to each other, without being limited thereto.

Each of the first terminal portion 110 and the second terminal portion 120 has a rectangular parallelepiped shape and has a predetermined length extended along the second direction D2. The first terminal portion 110 and the second terminal portion 120 have a substantially same length along the second direction D2. In an embodiment, the first terminal portion 110 and the second terminal portion 120 may have different lengths.

The first terminal portion 110 and the second terminal portion 120 have a substantially same thickness. In an alternative embodiment, the first terminal portion 110 and the second terminal portion 120 may have different thicknesses. The first terminal portion 110 and the second terminal portion 120 each have a thickness which is greater than a thickness of the heating portion 130.

Referring to FIG. 1, for example, a thickness of the heating portion is taken along the first direction D1 and/or the third direction D3, while a thickness of the first terminal portion 110 and the second terminal portion 120 is taken along the third direction D3. In an embodiment, each of the first terminal portion 110, the second terminal portion 120 and the heating portion 130 may define a major surface (e.g., the largest planar surface), and a respective thickness of the various portions may be taken in a direction normal to the major surface thereof, without being limited thereto. In an embodiment a respective thickness of the first terminal portion 110, the second terminal portion 120 and the heating portion 130 may be defined as a minimum dimension thereof along the direction normal to the major surface thereof, without being limited thereto.

The heating portion 130 may be connected to the first terminal portion 110 and the second terminal portion 120. That is, one side (e.g., a first side) of the heating portion 130 may be connected to the first terminal portion 110, and another side thereof (e.g., a second side opposite to the first side) may be connected to the second terminal portion 120. That is, the heating portion 130 may connect the first terminal portion 110 and the second terminal portion 120 to each other. The heating portion 130 may connect the first terminal portion 110 and the second terminal portion 120 to each other along an entirety of the length of the bending device 100, without being limited thereto.

Power applied to the bending device 100 from outside thereof, provides a flow of electrical current through the heating portion 130, from the first terminal portion 110 to the second terminal portion 120, and heat is generated in the heating portion 130 due to electrical resistance relative to the electrical current. That is, the heating portion 130 is heatable by a flow of electrical current from the first terminal portion 110 to the second terminal portion 120 such as to remove a portion of material of a display device.

A lower end surface of the heating portion 130 is defined furthest from the first terminal portion 110 and the second terminal portion 120 along the first direction D1. The lower end surface is a surface at which the bending device 100 contacts a material for removal thereof. Referring to FIG. 1, before heating, the lower end surface of the heating portion 130 has a concave shape which extends recessed along the first direction D1 from a plane defined by the second direction D2 and the third direction D3 (e.g., solid line compared to the dotted line in FIG. 1). Referring to FIG. 2, after heating, the lower end surface of the heating portion 130 has a planar shape. The lower end surface of the heating portion 130 may be disposed in the plane defined by the second direction D2 and the third direction D3, without being limited thereto (e.g., solid line compared to the dotted line in FIG. 2). That is, the lower end surface of the heating portion 130 may be bendable or deformable between the concave shape and the planar shape.

In an embodiment, for example, the lower end surface of the heating portion 130 has a concave shape recessed along the first direction D1 when a temperature is about 25 degrees Celsius (° C.) before heating, and has a planar shape when a temperature is about 40° C. after heating.

The heating portion 130 may include a metal material. In an embodiment, for example, the heating portion 130 may include Invar, which is an alloy of steel and nickel.

In such a case, for example, a coefficient of thermal expansion ("CTE") of the heating portion 130 after heating is about 1.3 parts per million per degree Celsius (ppm/° C.) when the temperature is about 93° C., about 4.18 ppm/° C. when the temperature is about 260° C., and about 7.6 ppm/° C. when the temperature is about 371° C.

The heating portion 130 may have an electrical resistivity in a range from about 0.000070 ohm per centimeter (Ω/cm) to about 0.00010 Ω/cm. In an embodiment, for example, the heating portion 130 has an electrical resistivity of about 0.000082 Ω/cm.

A density of the heating portion 130 is, for example, about 8.05 grams per cubic centimeter (g/cc).

The heating portion 130 may have a conductivity in a range from about 9.9 watt/meter/K (W/mK) to about 10.5 W/mK. In an embodiment, for example, the heating portion 130 has a thermal conductivity of about 10.15 W/mK.

The heating portion 130 may have a modulus of, for example, about 148 gigapascals (GPa).

The heating portion 130 has a thickness less than a thickness of each of the first terminal portion 110 and the second terminal portion 120. That is, the first terminal portion 110 has a thickness greater than the thickness of the heating portion 130, and the second terminal portion 120 has a thickness greater than the thickness of the heating portion 130. In such an embodiment, the first terminal portion 110 and the second terminal portion 120 may have a substantially same thickness, and may each have a thickness at least greater than the thickness of the heating portion 130.

Since the heating portion 130 has the thickness less than the thickness of each of the first terminal portion 110 and the second terminal portion 120, heat may be generated due to electrical resistivity, faster in the heating portion 130 than in the first terminal portion 110 and/or the second terminal portion 120. In addition, heat of a higher temperature may be generated in the heating portion 130 than a temperature of heat generated in the first terminal portion 110 and/or the second terminal portion 120.

Figure 3:
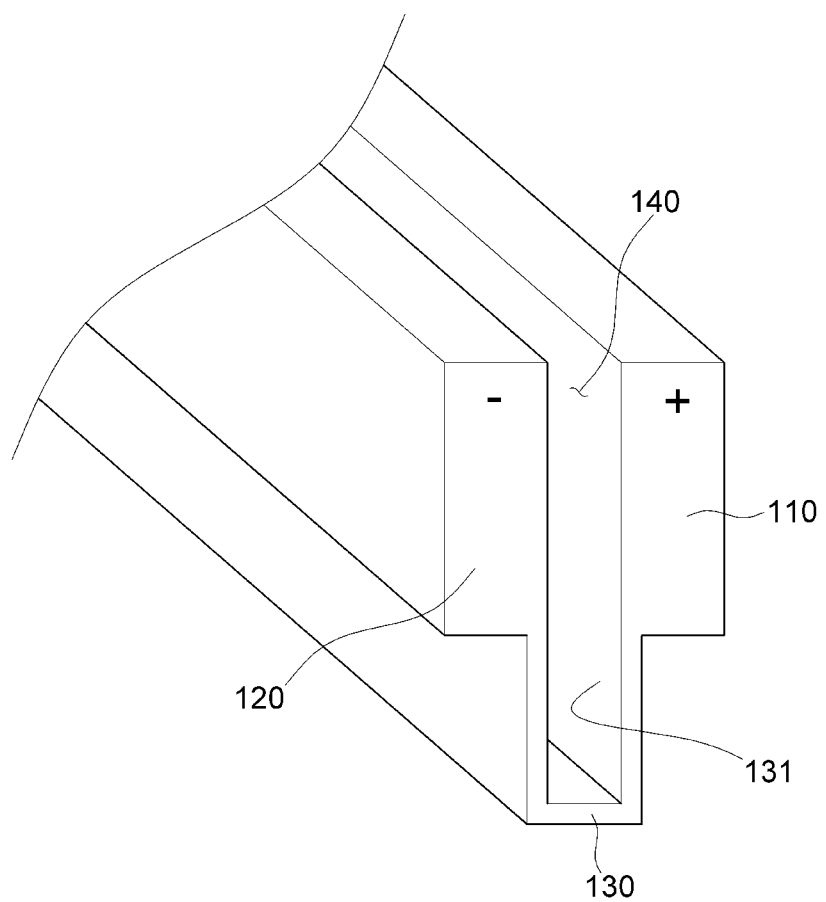
FIG. 3 is a perspective view illustrating an embodiment a first inner surface of a heating portion of a material-removing device.
Figure 4:
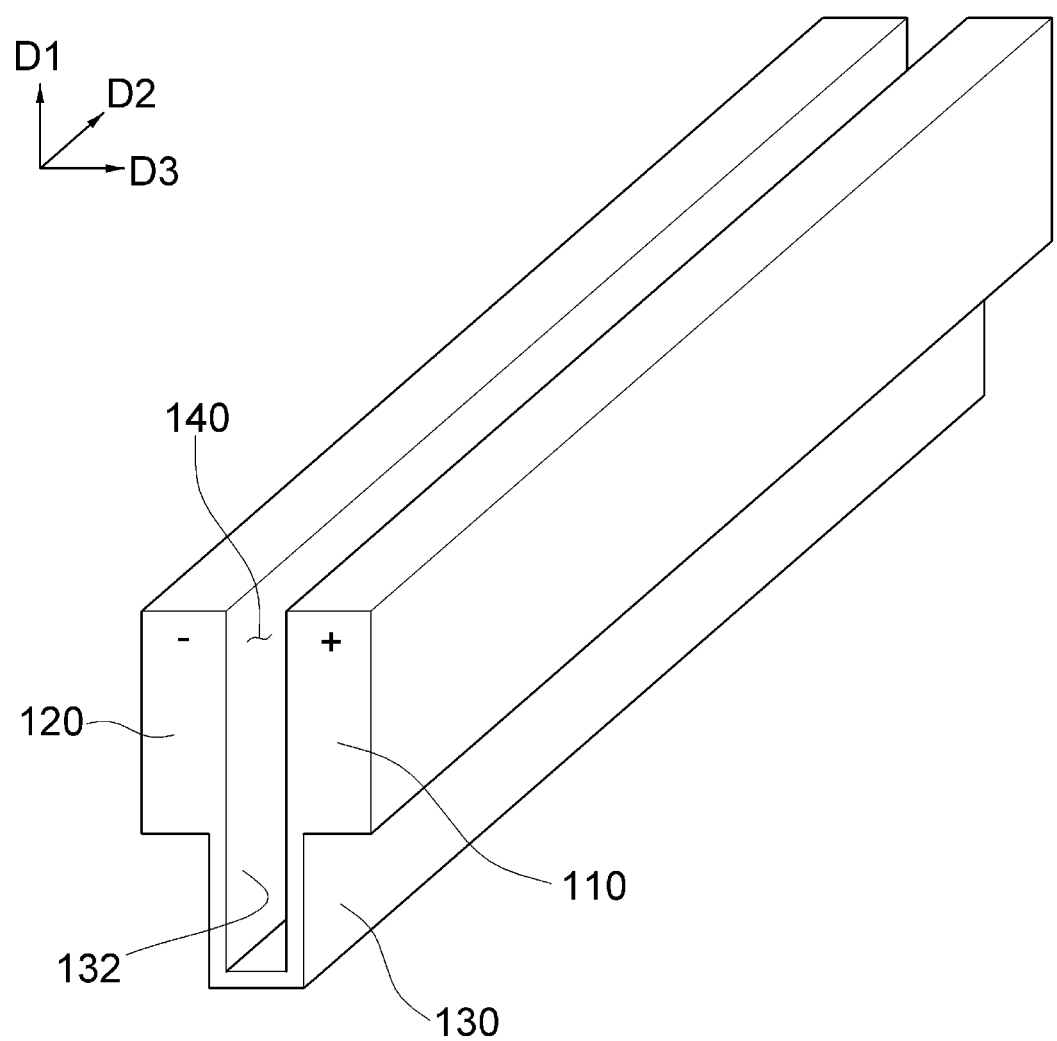
FIG. 4 is a perspective view illustrating an embodiment of a second inner surface of the heating portion of the material-removing device.

FIG. 3 is a perspective view illustrating an embodiment of a first inner surface 131 of the heating portion 130, and FIG. 4 is a perspective view illustrating an embodiment of a second inner surface 132 of the heating portion 130.

A boundary between the heating portion 130 and the first terminal portion 110 may be defined along the first direction D1, at a location where a thickness taken along the third direction D3 is different to respectively define the heating portion 130 and the first terminal portion 110. As illustrated in FIG. 3, a first inner surface 131 of the heating portion 130 and an inner surface of the first terminal portion 110 are in a substantially same plane (e.g., coplanar with each other to form a single inner surface of the bending device 100).

Figure 8:
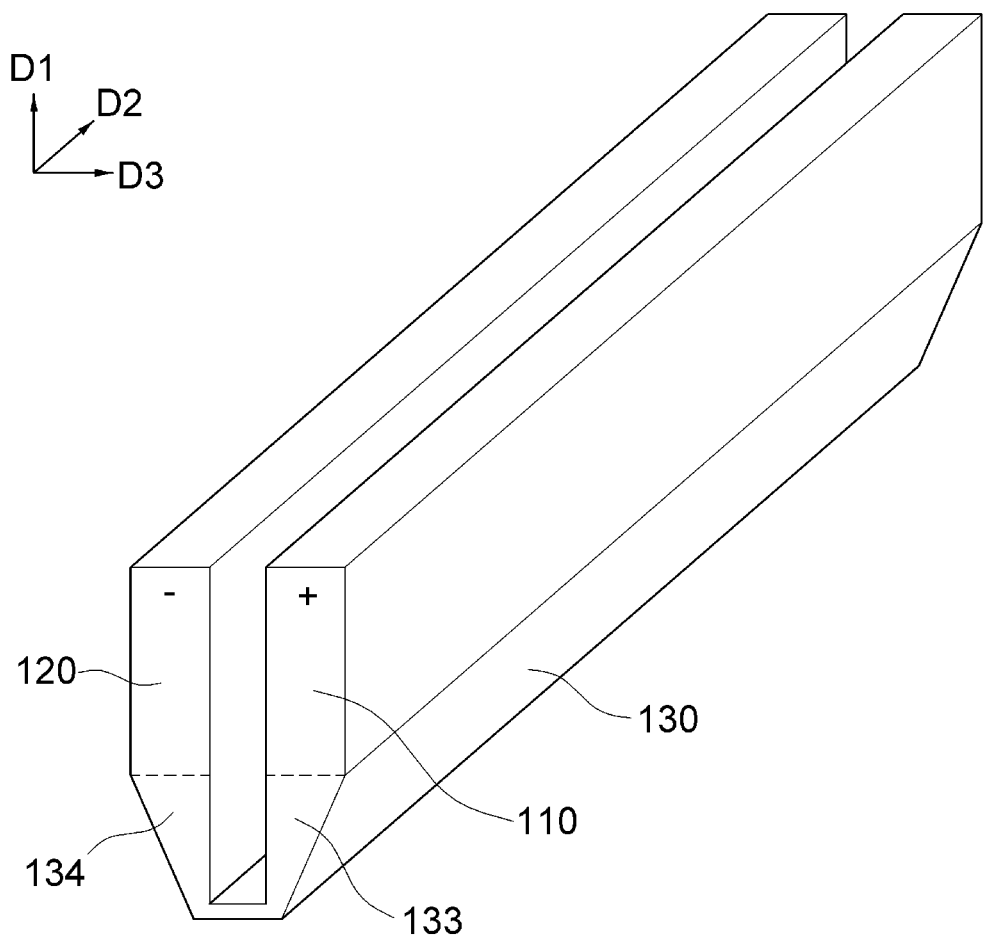
FIG. 8 is a perspective view illustrating another embodiment of a film removing device.

A boundary between the heating portion 130 and the second terminal portion 120 may be defined along the first direction D1, at a location where a thickness taken along the third direction D3 is different to respectively define the heating portion 130 and the second terminal portion 120 (e.g., dotted line boundary in FIG. 8). As illustrated in FIG. 4, a second inner surface 132 of the heating portion 130 and an inner surface of the first terminal portion 110 are in a substantially same plane (e.g., coplanar with each other to form a single inner surface of the bending device 100).

Accordingly, the bending device 100 defines a first heat dissipation groove 140 by the first terminal portion 110, the second terminal portion 120, and the heating portion 130. That is, the first inner surface 131 of the heating portion 130 extends from the inner surface of the first terminal portion 110 and is located in a plane substantially the same as a plane on which the inner surface of the first terminal portion 110 is located, and the second inner surface 132 of the heating portion 130 extends from an inner surface of the second terminal portion 120 and is in a plane substantially the same as a plane on which the inner surface of the second terminal portion 120 is located, thereby defining the first heat dissipation groove 140 between the first terminal portion 110 and the second terminal portion 120. The first heat dissipation groove 140 is defined between two of the single inner surfaces of the bending device 100, together with an inner surface of the heating portion 130. The first heat dissipation groove 140 extends from between the first terminal portion 110 and the second terminal portion 120 to between the first inner surface 131 and the second inner surface 132. The first heat dissipation groove 140 is open along the first direction D1. The first heat dissipation groove 140 may also be open along the second direction D2 (e.g., at one or more end of the bending device 100).

Figure 5:
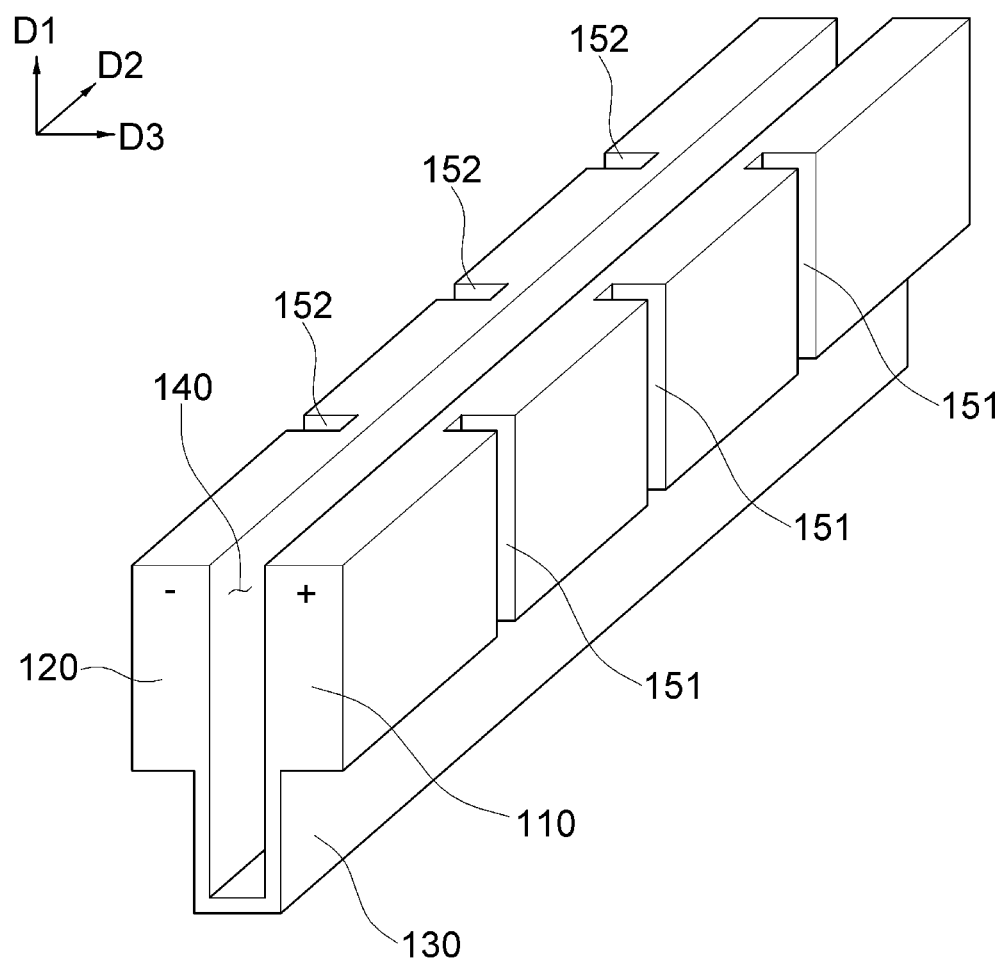
FIG. 5 is a perspective view illustrating an embodiment of a first terminal portion and a second terminal portion of a film removing device.

FIG. 5 is a perspective view illustrating an embodiment of a first terminal portion 110 and a second terminal portion 120 of a bending device 100.

Referring to FIG. 5, the first terminal portion 110 includes or defines a second heat dissipation groove 151 which is open to outside the bending device 100 along the first direction D1 and/or the third direction D3. The second heat dissipation groove 151 may be provided in plural (e.g., second heat dissipation grooves 151) arranged along a length of the bending device 100 (e.g., along the second direction D2). A length of the second heat dissipation groove 151, as a maximum dimension thereof, is defined along the first direction D1, while a width of the second heat dissipation groove 151 is defined along the second direction D2 and a depth of the second heat dissipation groove 151 is defined along the third direction D3.

The second terminal portion 120 includes or defines a second heat dissipation groove 152 which is open to outside the bending device 100 along the first direction D1 and/or the third direction D3. The second heat dissipation groove 152 may be provided in plural (e.g., second heat dissipation grooves 152) arranged along the length of the bending device 100 (e.g., along the second direction D2). A length of the second heat dissipation groove 152, as a maximum dimension thereof, is defined along the first direction D1, while a width of the second heat dissipation groove 152 is defined along the second direction D2 and a depth of the second heat dissipation groove 152 is defined along the third direction D3. That is, the second heat dissipation groove 151 and/or the second heat dissipation groove 152 has a dimension (e.g., length) along the first direction D1 that is greater than a dimension (e.g., width) thereof along the second direction D2.

The second heat dissipation grooves 151 and the second heat dissipation grooves 152 may be arranged at a predetermined interval along the second direction D2.

In an embodiment, for example, the first terminal portion 110 may have the second heat dissipation grooves 151 each in a shape of a rectangular parallelepiped shape which is open at an outer side surface of the first terminal portion 110, arranged at a predetermined interval in the second direction D2. The second heat dissipation groove 151 has a predetermined depth, and when heat is generated in the first terminal portion 110 due to electrical resistivity, the second heat dissipation groove 151 compensates for expansion of a material within a limited length of the first terminal portion 110.

In such a case, each individual one of the second heat dissipation grooves 151, located at a predetermined interval along the second direction D2 at the outer side surface of the first terminal portion 110, may be defined having a predetermined width, and having a length along the first direction D1 that is substantially the same as a length of the first terminal portion 110 along the first direction D1 at location other than the second heat dissipation groove 151. That is, each of the second heat dissipation grooves 151 is defined extended along the first direction D1 that crosses the second direction D2 which is a length direction of the first terminal portion 110. Accordingly, even if material of the first terminal portion 110 expands in the second direction D2 due to heat, the second heat dissipation groove 151 accommodates the extended length of the material of the first terminal portion 110, thereby substantially reducing or effectively preventing an overall length of the first terminal portion 110 from increasing due to heat.

In addition, the second terminal portion 120 may have the second heat dissipation grooves 152 each in a shape of a rectangular parallelepiped shape which is open at an outer side surface of the second terminal portion 120, arranged at a predetermined interval along the second direction D2. The second heat dissipation groove 152 has a predetermined depth, and when heat is generated in the second terminal portion 120 due to electrical resistivity, the second heat dissipation groove 152 compensates for expansion of a material within a limited length of the second terminal portion 120.

In such a case, each individual one of the second heat dissipation groove 152, located at a predetermined interval along the second direction D2 at the outer side surface of the second terminal portion 120, may be defined having a predetermined width, and having a length along the first direction D1 that is substantially the same as a length of the second terminal portion 120 along the first direction D1 at location other than the second heat dissipation groove 152. That is, each of the second heat dissipation grooves 152 is defined extended along the first direction D1 that crosses the second direction D2 which is a length direction of the second terminal portion 120. Accordingly, even if material of the second terminal portion 120 expands along the second direction D2 due to heat, the second heat dissipation groove 152 accommodates the extended length of the material of the second terminal portion 120, thereby substantially reducing or effectively preventing an overall length of the second terminal portion 120 from increasing.

Figure 6:
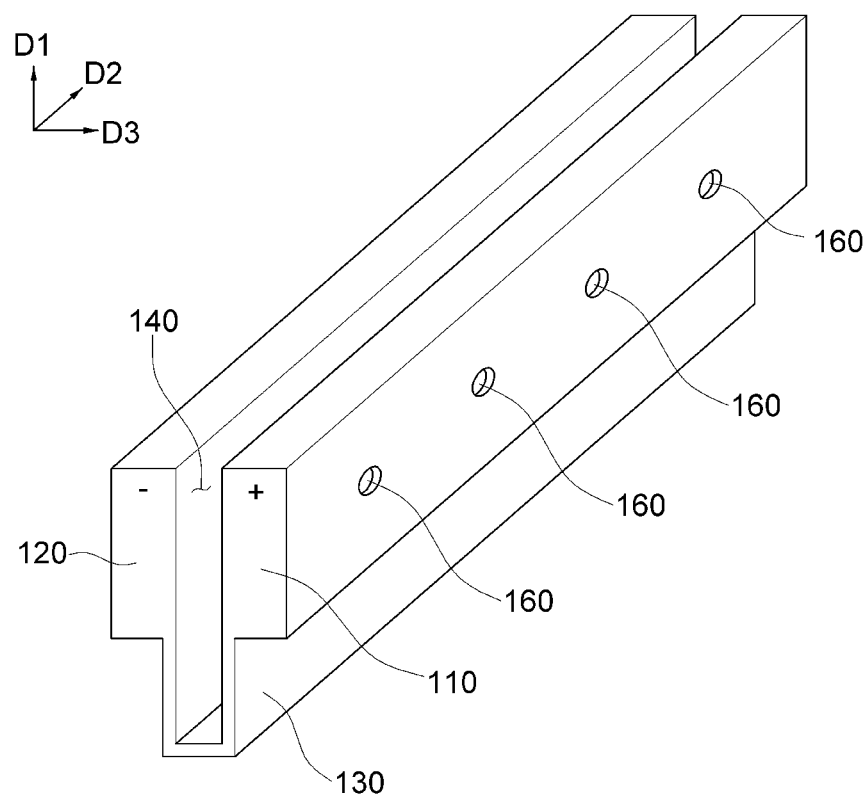
FIG. 6 is a perspective view illustrating another embodiment of a first terminal portion and a second terminal portion of a film removing device.

FIG. 6 is a perspective view illustrating another embodiment of a first terminal portion 110 and a second terminal portion 120 of a bending device 100.

Referring to FIG. 6, the first terminal portion 110 and the second terminal portion 120 may include or define a first through hole 160. The first through hole 160 may be provided in plural (e.g., first through holes 160) arranged at a predetermined interval along the second direction D2.

The first through hole 160 has a circular cross-sectional shape.

In addition, the first through hole 160 may extend from the inner side surface of the first terminal portion 110 to the outer side surface thereof which opposes the inner side surface along a third direction D3. The first through hole 160 may extend completely through a thickness of the first terminal portion 110, from the outer surface thereof to the first heat dissipation groove 140. The first through hole 160 may be open at both the outer side surface of the first terminal portion 110 and at the inner side surface thereof. That is, the first terminal portion 110 may include or define one or more of the first through hole 160 defined therethrough, extending from an outer side surface of the first terminal portion 110 to an inner side surface thereof which opposes the outer side surface along the third direction D3, provided or arranged at a predetermined interval along the second direction D2. The first through hole 160 passes through a thickness of the first terminal portion 110, with a depth of the first through hole 160 corresponding to a total thickness of the first terminal portion 110. When heat is generated in the first terminal portion 110 by electrical resistivity, the first through hole 160 accommodates material of the first terminal portion 110 which is extended by the heat of the first terminal portion 110. Accordingly, the first terminal portion 110 may have a temperature change due to generation of heat, but the overall length thereof does not change with the temperature change.

In addition, the first through hole 160 may extend from an inner side surface of the second terminal portion 120 to an outer side surface thereof which opposes the inner side surface along a third direction D3. The first through hole 160 may extend completely through a thickness of the second terminal portion 120, from the outer surface thereof to the first heat dissipation groove 140. The first through hole 160 may be open at both the outer side surface of the second terminal portion 120 and at the inner side surface thereof. That is, the second terminal portion 120 may include or define one or more of the first through hole 160, extending from an inner side surface of the second terminal portion 120 to an outer side surface thereof which opposes the inner side surface along the third direction D3, provided or arranged at a predetermined interval along the second direction D2. The first through hole 160 passes through a thickness of the second terminal portion 120, with a depth of the first through hole 160 corresponding to a total thickness of the second terminal portion 120. When heat is generated in the second terminal portion 120 by electrical resistivity, the first through hole 160 accommodates the material of the first terminal portion 110 which is extended by the heat of the second terminal portion 120. Accordingly, the second terminal portion 120 may have a temperature change due to generation of heat, but the overall length thereof does not change with the temperature change.

An initial overall length (e.g., before heat or no heat applied) of the first terminal portion 110 and the second terminal portion 120 is defined by material of a respective terminal portion between ends thereof along the second direction D2. However, when heat is generated due to electrical resistivity, material of the first terminal portion 110 and the second terminal portion 120 extends along the second direction D2 and into an area of the through holes 160 due to the heat. However, an overall length of each of the first terminal portion 110 and the second terminal portion 120 along the second direction D2 (e.g., between ends) does not change owing to the material extending into the through holes 160. That is, the first terminal portion 110 and the second terminal portion 120 may have a structure capable of better accommodating such change in length along the second direction D2.

Figure 7:
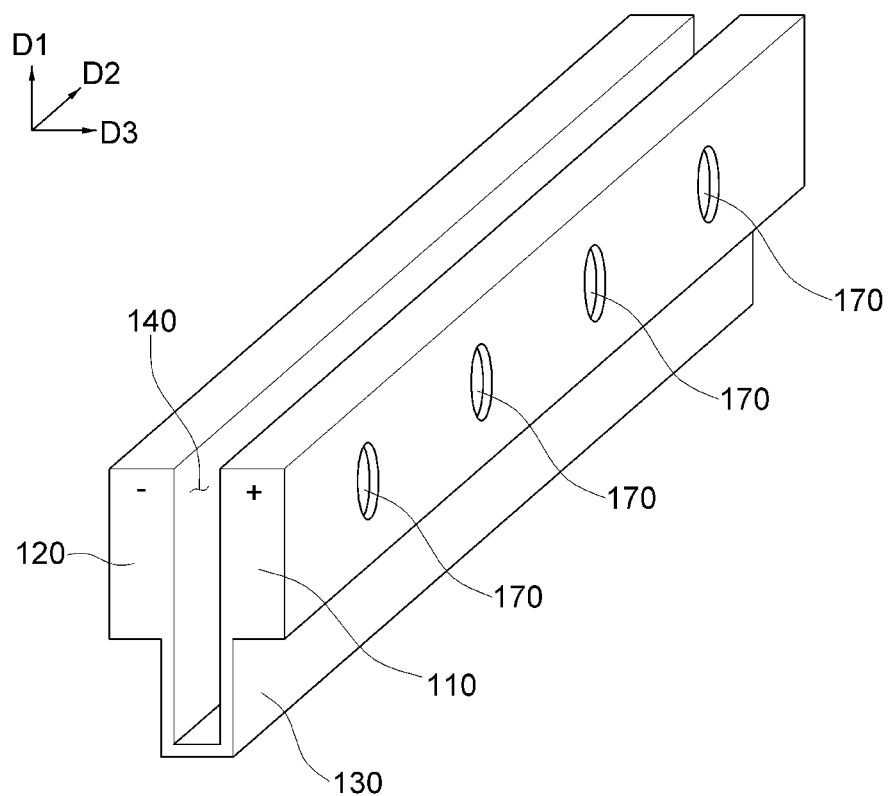
FIG. 7 is a perspective view illustrating a modified embodiment of a first terminal portion and a second terminal portion of a material-removing device.

To further enhance this effect, the at least one through hole may have an oval shape, as illustrated in FIG. 7. FIG. 7 is a perspective view illustrating a modified embodiment of a first terminal portion 110 and a second terminal portion 120. As illustrated in FIG. 7, the first terminal portion 110 and the second terminal portion 120 may include or define a second through hole 170. The second through hole 170 may be provided in plural (e.g., second through holes 170) arranged at regular intervals along the second direction D2. In such a case, the second through hole 170 may have an oval shape with a major axis along the first direction D1 and a minor axis along the second direction D2 to better accommodate the change in length of the bending device 100 along the second direction D2.

Accordingly, when heat is generated due to electrical resistivity, the first terminal portion 110 and the second terminal portion 120 are subject to a deformation force greater in the second direction D2 (e.g., the minor axis of the second through hole 170) than the first direction D1 (e.g., the major axis of the second through hole 170), thus extending a length of material of the bending device 100 along the second direction D2 due to heat. The extended length of the material of the first terminal portion 110 and the second terminal portion 120 is accommodated through the plurality of second through holes 170.

Accordingly, a change in overall length (e.g., between ends) along the second direction D2 due to the temperature change does not occur in the first terminal portion 110 and the second terminal portion 120 due to one or more of the second through hole 170.

FIG. 8 is a perspective view illustrating another embodiment of a bending device 100.

Referring to FIG. 8, the heating portion 130 may include a first connection portion 133 and a second connection portion 134. The heating portion 130 may further include a third connection portion which connects the first connection portion 133 and the second connection portion 134 to each other. The third connection portion is defined furthest from the first terminal portion 110 and the second terminal portion 120 along the first direction D1. The third connection portion defines the lower end surface of the heating portion 130 discussed above.

The first connection portion 133 extends from the first terminal portion 110 to be located between the first terminal portion 110 and the third connection portion of the heating portion 130. A thickness of the first connection portion 133 along the third direction D3 decreases as a distance from the first terminal portion 110 increases (e.g., in a direction toward the third connection portion of the heating portion 130).

The second connection portion 134 extends from the second terminal portion 120 to be located between the second terminal portion 120 and the third connection portion of the heating portion 130. A thickness of the second connection portion 134 along the third direction D3 decreases as a distance from the second terminal portion 120 increases (e.g., in a direction toward the third connection portion of the heating portion 130).

That is, in the heating portion 130 connected to the first terminal portion 110 and the second terminal portion 120, the first connection portion 133 and the second connection portion 134 have a shape in which thicknesses of the first connection portion 133 and the second connection portion 134 in the third direction D3 are gradually reduced in a direction towards the third connection portion along the first direction D1.

Referring to FIG. 8, the lower end surface of the heating portion 130 at the third connection portion thereof, forms an obtuse angle with an outer surface of both the first connection portion 133 and the second connection portion 134. Referring to FIG. 4, for example, the lower end surface of the heating portion 130 at the third connection portion thereof, forms less than an obtuse angle with outer surfaces which respectively oppose the first inner surface 131 and the second inner surface 132. An angle less than the obtuse angle may include an angle of about 90° without being limited thereto. A thickness of the heating portion 130 at the first inner surface 131 and the second inner surface 132 in FIG. 4 may be uniform as a distance from a respective terminal portion increases along the first direction D1, without being limited thereto.

Figure 9:
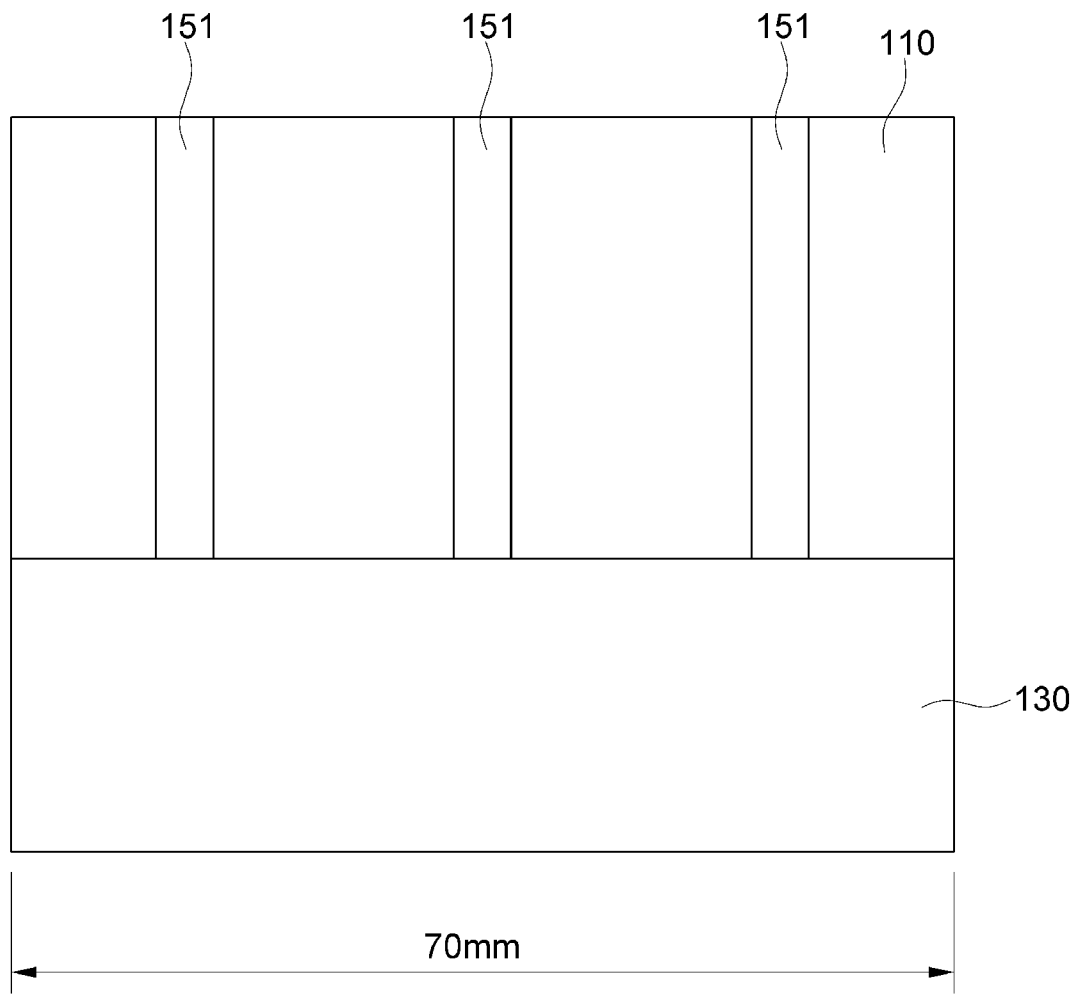
FIG. 9 is a cross-sectional view illustrating an embodiment of a film removing device.
Figure 9:
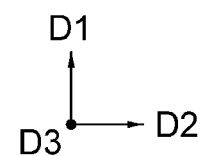

FIG. 9 is a cross-sectional view illustrating an embodiment of a bending device 100, viewed in a third direction D3.

Referring to FIG. 9, together with FIG. 5, for example, when the bending device 100 is viewed in the third direction D3, the first terminal portion 110 is located at an upper portion, and the heating portion 130 is located at a lower portion.

At the first terminal portion 110, one or more second heat dissipation grooves 151 are arranged at regular intervals along the second direction D2.

The heating portion 130 may have a predetermined length along the second direction D2. In an embodiment, the heating portion 130 has a length of, for example, about 70 millimeters (mm).

The heating portion 130 may generate heat of a temperature higher than a temperature at which a material of an object to be processed (e.g., film 101 in FIGS. 1 and 2 is deformed or melted by the heating portion 130 which is heated).

The heating portion 130 may be deformed due to thermal expansion at a temperature of about 300° C. or more and about 600° C. or less.

When the heating portion 130 includes Invar, the heating portion 130 may have an electrical resistivity in a range from about 0.000070 Ω/cm to about 0.00010 Ω/cm. In an embodiment, for example, the heating portion 130 has an electrical resistivity of about 0.000082 Ω/cm.

In the bending device 100, when power is applied from the outside the bending device 100 and through the first terminal portion 110, an electrical current flows through the heating portion 130, from the first terminal portion 110 to the second terminal portion 120.

In such a case, a Joule heat (b) is generated according to electrical energy (power), and the heating portion 130 converts the Joule heat (b) into a dissipation heat (a) based on electrical resistivity, thus discharging the dissipation heat (a), as in the following Equation 1. Accordingly, a sum of the Joule heat (b) and an amount of the dissipation heat (a) becomes zero.

Equation 1

$$\nabla \cdot \underbrace{(k_t \nabla T)}_{(a)} + \underbrace{\nabla^T k_e \nabla V}_{(b)} = 0$$

In Equation 1, (a) represents the dissipation heat generated due to the electrical resistivity in the heating portion 130, and (b) represents the Joule heat generated due to the electrical energy of the first terminal portion 110 and the second terminal portion 120.

Each of the first terminal portion 110 and the second terminal portion 120 has a predetermined length, for example, about 70 mm, along the second direction D2. Although thermal expansion occurs in the material of the first terminal portion 110 and the second terminal portion 120 due to the Joule heat generated due to the electrical energy, the second heat dissipation grooves 151 and 152 accommodate the length of the material which is extended due to thermal expansion, such that opposing ends of the a respective terminal portion are not displaced. Accordingly, the total length (e.g., between ends) of the first terminal portion 110 and the second terminal portion 120 may not exceed about 70 mm although thermal expansion of the material within the respective terminal portion occurs, due to the second heat dissipation grooves 151 and 152 at which the extended material is accommodated. That is, even though a temperature changes due to heat generation, a physical change in the total length of the first terminal portion 110 and the second terminal portion 120 (e.g., between ends) does not occur.

A temperature of the heating portion 130 increases as heat is generated due to the electrical resistivity. When the temperature rises, a thermal stress is generated as illustrated in the following Equation 2, and accordingly, thermal expansion occurs and the material of the heating portion 130 extends.

Equation 2

$\nabla \cdot \sigma = 0$            (c)

$\sigma = E(\varepsilon - \alpha(T - T_{amb})I)$            (d)

In Equation 2, $\nabla$ represents a gradient, $\sigma$ represents a thermal stress, E represents an elastic modulus, $\varepsilon$ represents a strain, $\alpha$ represents a coefficient of thermal expansion, T represents a temperature of the heating portion, $T_{amb}$ represents an ambient temperature, and I represents a deformation amount according to the length of the heating portion.

That is, the thermal stress $\sigma$ is calculated by multiplying the elastic modulus E by the strain c and the deformation amount I. In such a case, the strain $\varepsilon$ is a strain based on coefficient of thermal expansion $\alpha$ and a temperature change $T-T_{amb}$.

Figure 10A:
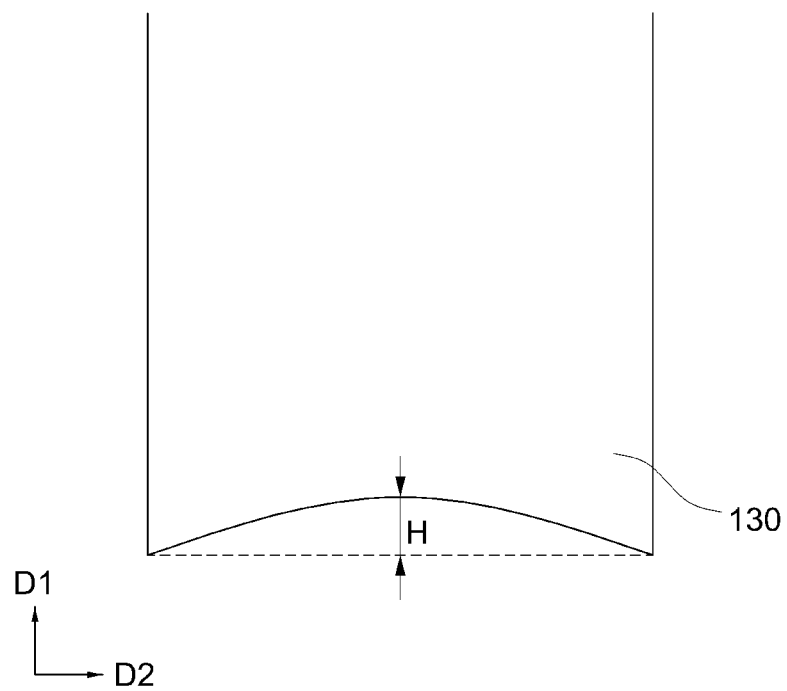
FIG. 10(a) is a cross-sectional view illustrating an embodiment of a heating portion before heating thereof and FIG. 10(b) is a cross-sectional view of the heating portion which is heated.
Figure 10B:
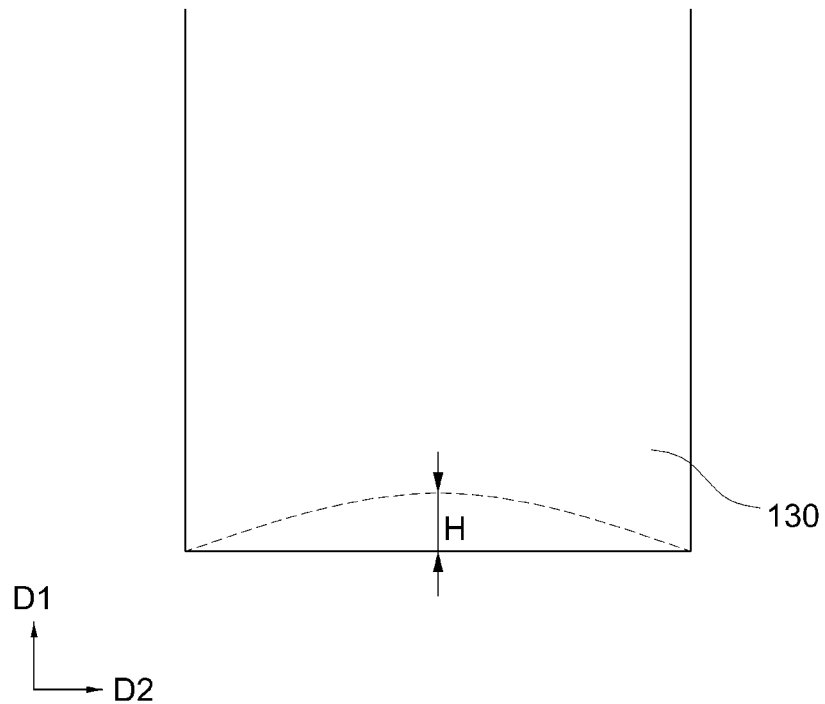
Figure 11:
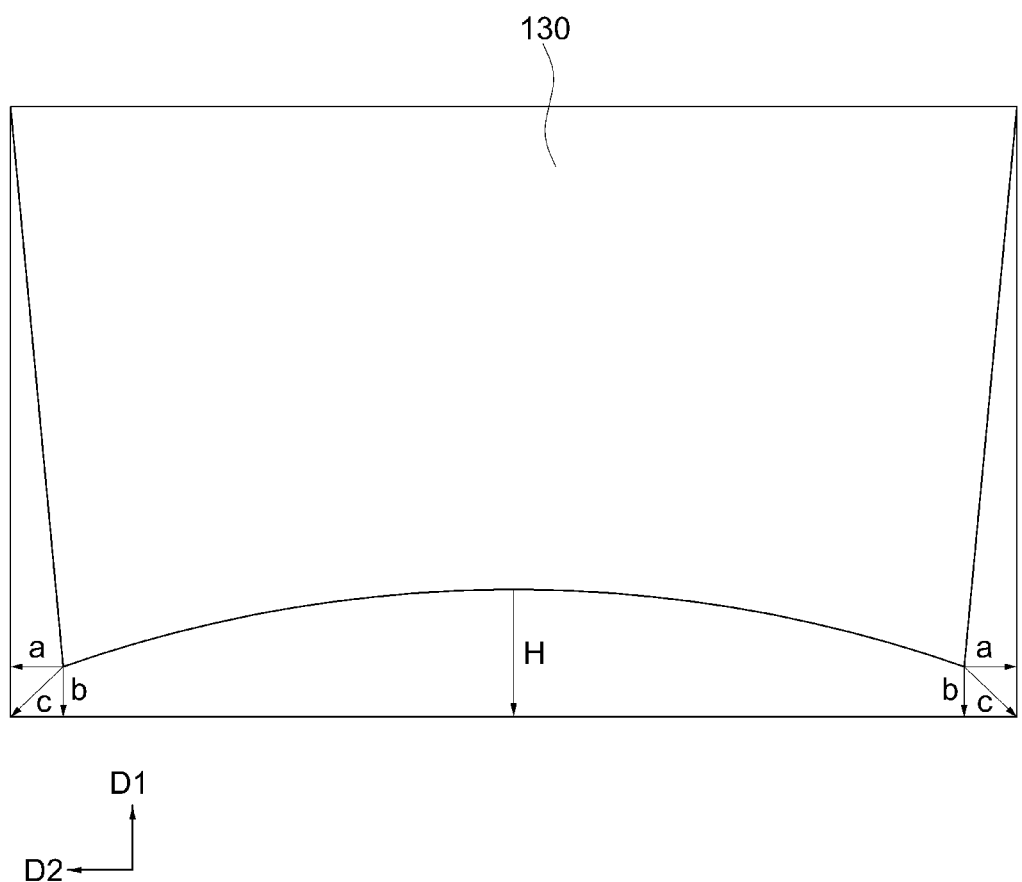
FIG. 11 is a cross-view illustrating an embodiment of dimension changes of a heating portion which is heated.

FIG. 10(a) is a cross-sectional view illustrating an embodiment of a heating portion 130 which is un-heated (e.g., before heating), FIG. 10(b) is a cross-sectional view of the heating portion 130 which is heated, and FIG. 11 is a cross-sectional view illustrating an embodiment of dimension changes of a heating portion 130.

As illustrated in the view FIG. 10(a), a lower end surface of the heating portion 130 has a shape that is concave (solid line in FIG. 10(a)) along the first direction D1 before heating of the bending device 100. As illustrated in FIG. 10(b), the lower end surface of the heating portion 130 is displaced from the concave shape to be disposed a planar shape (solid line in FIG. 10(b)) by heat application to the bending device 100, due to thermal expansion. FIG. 11 is a cross-sectional view of an embodiment of displacement of end portions of the heating portion 130.

Since the heating portion 130 has a thickness less than the thickness of each of the first terminal portion 110 and the second terminal portion 120, heat is generated faster in the heating portion 130 than in the first terminal portion 110 and the second terminal portion 120, and the temperature of the generated heat rises faster in the heating portion 130 than in the first terminal portion 110 and the second terminal portion 120.

Taking FIGS. 1, 2 and 9-11 together, for example, one or more embodiment of the bending device 100 including a heater of a resistance heating type disposes a bottom surface of the bending device 100 in a planar state after heating of the bending device 100.

In an embodiment of manufacturing a display device, processes are performed to a member M (e.g., a display panel of the display device) having a film 101 thereon, by the bending device 100 having the lower end surface which is planar. More particularly, the lower end surface of the bending device 100 has a planar area with a relatively short width in the third direction D3 and a length along the second direction D2, to contact the film 101 to be processed. Accordingly, portions of the film 101 which are contacted by the bending device 100 may be removed from the member M while minimizing or effectively preventing deformation of a relatively soft portion of the member M (e.g., flexible substrate of a display panel) such that a display panel of a display device provided using the bending device 100 has a uniform flatness even at areas which are processed with the bending device 100.

The heating portion 130 may include a material that may withstand temperatures of about 600° C. or less.

In addition, the heating portion 130 may be deformed due to thermal expansion at a temperature of about 300° C. or more and about 600° C. or less.

That is, heat is generated in the heating portion 130 due to electrical resistivity. The heat is relatively easily conducted in the heating portion 130 as the temperature thereof rises since the heating portion 130 has a thickness less than a thickness of each of the first terminal portion 110 and the second terminal portion 120, such that a material of the heating portion 130 expands and extends as the temperature rises. In embodiments, a material of the heating portion 130 extends with the coefficient of thermal expansion of about 1.3 ppm/° C. at a temperature of about 93° C., with the coefficient of thermal expansion of about 4.18 ppm/° C. at a temperature of about 260° C., and with the coefficient of thermal expansion of about 7.6 ppm/° C. at a temperature of about 371° C.

Accordingly, as illustrated in FIG. 10(a), the lower end surface of the heating portion 130 has a shape that is concave in a positive (+) first direction D1 before heating. After heating, however, the temperature of the heating portion 130 rises, and the lower end surface of the heating portion 130 expands, by a distance H in a negative (−) first direction D1, due to thermal expansion, and becomes planar as illustrated in FIG. 10(b).

The distance H at which the heating portion 130 is deformed, from a concave shape before heating to a planar shape after heating may be maximum along the first direction D1, at a center portion of the heating portion 130 which is taken along the second direction D2. That is, a dimension of the heating portion 130 along the first direction D1 may be defined between the lower end surface furthest from a respective terminal portion, to a boundary between the heating portion 130 and the respective terminal portion. The dimension of the heating portion 130 along the first direction D1 may increase by the extension of the lower end surface a concave shape to a planar shape after heating. In an embodiment, the increased dimension (e.g., distance H) taken at the center portion of the heating portion 130 which is defined along the second direction D2 may about 21 micrometers (μm) along the first direction D1.

The heating portion 130 may generate heat having a temperature higher than a temperature at which a material of an object to be processed is melted. In an embodiment of manufacturing a display device, a film 101 (e.g., protective film as an object to be processed) may be attached to a member M (e.g., display panel having a relatively soft flexible substrate) prior to further processing the display panel for forming a display device. In an embodiment, for example, in order to remove a portion or an entirety of the protective film attached to the display panel, the heating portion 130 may generate a heat having a temperature higher than a melting temperature of the protective film, e.g., higher than about 465° C.

Referring to FIG. 11, before heating, a distance between opposite ends of the heating portion 130 along the second direction D2 may be less than the length of each of the first terminal portion 110 and the second terminal portion 120.

A distance between opposite ends of the heating portion 130 along the second direction D2 may be substantially equal to or less than the length of each of the first terminal portion 110 and the second terminal portion 120 after heating. Each end portion may move a length (a) along the second direction D2 to be disposed substantially corresponding to ends of each of the first terminal portion 110 and the second terminal portion 120 after heating. Each end portion may move a length (b) along the first direction D1 to define the lower end surface of the heating portion 130 having a planar shape after heating.

Opposing ends of the heating portion 130, when viewed along the third direction D3, may extend, after heating, by a length calculated by a vector sum (c) of a length (b) extending along the first direction D1 and a length (a) extending along the second direction D2.

Referring to FIG. 11, for example, each of lower corners of the heating portion 130 which are on opposite sides thereof extend, after heating, by about 102 μm in a negative (−) first direction D1 than before heating (e.g., b=102 μm). A right lower corner portion extends, after heating, by about 92 μm in a negative (−) second direction D2 than before heating (e.g., a=92 μm), and a left lower corner portion extends, after heating, by about 92 μm in a positive (+) second direction D2 than before heating (e.g., a=92 μm).

In such an embodiment, along the second direction D2, the lower end surface of the heating portion 130 is planarized after heating, from a shape that is concave in the positive (+) first direction D1 before heating, and thus the heating portion extends by a distance H of about 21 μm in the negative (−) first direction D1.

In addition, the lower corners of the heating portion 130 which are on the opposite sides thereof extend, after heating, in the negative (−) first direction D1 by about 102 μm, and both extend, after heating, along the second direction D2 by about 92 μm, thus extending in a diagonal direction (c) by about 137.3 μm.

Accordingly, although opposing corners extend respectively along the first direction D1 and the second direction D2 due to thermal expansion of the heating portion 130 after heating, a length of the heating portion 130 which is thermally expanded may not exceed the length of about 70 mm discussed above, and the lower end surface of the heating portion 130 becomes planarized, such that a portion or an entirety of the protective film may be uniformly removed from the display panel across an entirety of the length of the bending device 100.

One or more embodiment of a bending device 100 may be used in manufacturing display devices. More particularly, one or more embodiment of the bending device 100 may uniformly remove a portion or an entirety of a film 101 from another member M of the display device, such as in a chip on plate ("COP") process of the display device, by using a heater of a resistance heating type.

Accordingly, a member such as a display panel of a display device which has a uniform flatness may be manufactured through thermal processing while patterning a film on the display panel.

While the invention has been illustrated and described with reference to the embodiments thereof, it will be apparent to those of ordinary skill in the art that various changes in form and detail may be made thereto without departing from the spirit and scope of the invention.

What is claimed is:

1. A material-removing heater device comprising:
a first terminal portion defining a first electrode;
a second terminal portion defining a second electrode;
a respective terminal portion among the first terminal portion and the second terminal portion defining a second heat dissipation groove recessed from an outer surface of the respective terminal portion and open to the outside of the material-removing heater device; and
a heating portion which connects the first terminal portion to the second terminal portion, the heating portion heatable by a flow of electrical current from the first terminal portion to the second terminal portion to remove a portion of material of a display device,
wherein
a first direction is defined from the heating portion to the respective terminal portion,
a boundary is defined between the heating portion and the respective terminal portion,
a maximum dimension of the second heat dissipation groove is defined by the respective terminal portion and extends along the first direction from the boundary,
the heating portion defines a lower end surface of the material-removing heater device at which the material-removing heater device contacts the material of the display device,
the heating portion disposes the lower end surface to have a concave shape, and
the heating portion which is heated deforms the lower end surface from the concave shape to have a planar shape.

2. The material-removing heater device of claim 1, wherein the heating portion has a thickness less than a thickness of each of the first terminal portion and the second terminal portion.

3. The material-removing heater device of claim 2, wherein
the heating portion comprises a first inner surface and a second inner surface which face each other,
the first terminal portion and the second terminal portion each includes an upper surface which is furthest from the heating portion along the first direction, and an inner surface which extends in the first direction from the upper surface and to the heating portion, the inner surfaces of the first terminal portion and the second terminal portion facing each other,
the first inner surface of the heating portion and the inner surface of the first terminal portion are coplanar with each other, from the heating portion to the upper surface of the first terminal portion, and
the second inner surface of the heating portion and the inner surface of the second terminal portion are coplanar with each other, from the heating portion to the upper surface of the second terminal portion.

4. The material-removing heater device of claim 3, wherein the first terminal portion, the second terminal portion, and the heating portion together define a first heat dissipation groove of the material-removing heater device at which the first inner surface and the second inner surface of the heating portion face each other.

5. The material-removing heater device of claim 1, wherein
a second direction crossing the first direction is defined between ends of the material-removing heater device, and
the second heat dissipation groove is provided in plural comprising a plurality of second heat dissipation grooves arranged spaced apart from each other along the second direction.

6. The material-removing heater device of claim 1, wherein
the material-removing heater device defines a maximum dimension thereof as a length,
a respective terminal portion among the first terminal portion and the second terminal portion defines a plurality of through holes arranged spaced apart from each other along the length of the material-removing heater device, and
each through hole among the plurality of through holes is extended from the outer surface of the respective terminal portion to an inner surface thereof, the through hole being open to outside the material-removing heater device.

7. The material-removing heater device of claim 6, wherein the through hole has a circular shape or an elliptical shape which has a major axis along the first direction.

8. The material-removing heater device of claim 1, wherein
the heating portion further comprises:
a first connection portion extended from the first terminal portion,
a second connection portion extended from the second terminal portion and facing the first connection portion, and
a third connection portion connecting the first connection portion and the second connection portion to each other, the third connection portion defining the lower end surface of the material-removing heater device,
the first connection portion defines a thickness thereof which decreases as a distance from the first terminal portion increases, and
the second connection portion defines a thickness thereof which decreases as a distance from the second terminal portion increases.

9. The material-removing heater device of claim 1, wherein the heating portion which is heated to a temperature of about 300° C. or more and about 600° C. or less deforms the lower end surface from the concave shape to have the planar shape.

10. The material-removing heater device of claim 9, wherein the heating portion which is heated generates heat having a temperature higher than a temperature at which the material of the display device is melted.

11. The material-removing heater device of claim 1, wherein
the heating portion extends from both the first terminal portion and the second terminal portion along the first direction,
a second direction crossing the first direction is defined between ends of the material-removing heater device, and
the heating portion which is heated defines a maximum deformation distance between the concave shape and the planar shape along the first direction and at a central portion of the material-removing heater device along the second direction.

12. The material-removing heater device of claim 1, wherein
the heating portion extends from both the first terminal portion and the second terminal portion along the first direction,
a second direction crossing the first direction is defined between ends of the material-removing heater device, and
along the second direction, a length of the lower end surface of the heating portion which has the concave shape is less than a length of each of the first terminal portion and the second terminal portion.

13. The material-removing heater device of claim 12, wherein along the second direction, the length of the lower end surface of the heating portion which has the planar shape is equal to the length of each of the first terminal portion and the second terminal portion.

14. The material-removing heater device of claim 1, wherein a material of the heating portion comprises Invar.

15. The material-removing heater device of claim 14, wherein the lower end surface of the heating portion has the concave shape at a temperature of about 25° C., and has the planar shape at a temperature of about 450° C.

16. The material-removing heater device of claim 14, wherein the heating portion has a coefficient of thermal expansion of about 1.3 ppm/C at a temperature is about 93° C., about 4.18 ppm/C at a temperature is about 260° C., and about 7.6 ppm/C at a temperature is about 371° C.

17. The material-removing heater device of claim 14, wherein the heating portion has an electrical resistivity in a range from about 0.000070 Ω/cm to about 0.00010 Ω/cm.

18. The material-removing heater device of claim 14, wherein the heating portion has a conductivity in a range from about 9.9 W/mK to about 10.5 W/mK.

* * * * *